US011049037B2

(12) United States Patent
Gea-Banacloche et al.

(10) Patent No.: US 11,049,037 B2
(45) Date of Patent: Jun. 29, 2021

(54) DEVICES AND METHODS FOR QUANTUM LOGIC

(71) Applicant: Board of Trustees of the University of Arkansas, Little Rock, AR (US)

(72) Inventors: Julio Gea-Banacloche, Fayetteville, AR (US); William Konyk, Little Rock, AR (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 16/715,668

(22) Filed: Dec. 16, 2019

(65) Prior Publication Data

US 2020/0193320 A1 Jun. 18, 2020

Related U.S. Application Data

(60) Provisional application No. 62/779,943, filed on Dec. 14, 2018.

(51) Int. Cl.
| | | |
|---|---|---|
| *G02B 6/122* | (2006.01) | |
| *B82Y 20/00* | (2011.01) | |
| *G06N 10/00* | (2019.01) | |
| *B82Y 10/00* | (2011.01) | |
| *B82Y 15/00* | (2011.01) | |

(52) U.S. Cl.
CPC .............. *G06N 10/00* (2019.01); *B82Y 10/00* (2013.01); *B82Y 15/00* (2013.01); *B82Y 20/00* (2013.01); *G02B 6/1225* (2013.01)

(58) Field of Classification Search
CPC ............................. G06N 10/00; G02B 6/1225
See application file for complete search history.

(56) References Cited

U.S. PATENT DOCUMENTS

| | | | |
|---|---|---|---|
| 6,678,450 B1 | 1/2004 | Franson | |
| 7,755,821 B2 | 7/2010 | Ham | |
| 9,059,388 B2* | 6/2015 | Tahan | ................. H01L 49/006 |
| | (Continued) | | |

FOREIGN PATENT DOCUMENTS

| | | |
|---|---|---|
| KR | 20080036794 | 4/2008 |
| WO | 2018000137 | 1/2018 |

OTHER PUBLICATIONS

Aguiar, Antônio Francisco, Daniel Marchesi de C. Neves, and João Batista R. Silva. "All-optical logic gates devices based on SPP coupling between graphene sheets." Journal of Microwaves, Optoelectronics and Electromagnetic Applications 17.2 (2018): 208-216.

(Continued)

*Primary Examiner* — Sung H Pak
(74) *Attorney, Agent, or Firm* — Meunier Carlin & Curfman LLC

(57) ABSTRACT

In some aspects, the present disclosure relates to a quantum logic device which, in one embodiment, includes: at least two two-level emitters (TLEs); and a waveguide in a photonic crystal, the waveguide being coupled to the TLEs and configured for two propagating modes, the two propagating modes consisting of a left-traveling mode and a right-traveling mode, and wherein the TLEs and waveguide are configured such that a traveling photon interacting with a TLE of the TLEs is scattered into either the left-traveling mode or right-traveling mode.

19 Claims, 6 Drawing Sheets

(56) References Cited

U.S. PATENT DOCUMENTS

| | | | | |
|---|---|---|---|---|
| 10,359,272 | B2* | 7/2019 | Mower | G06N 10/00 |
| 10,763,347 | B2* | 9/2020 | Amin | H01L 29/423 |
| 10,770,545 | B2* | 9/2020 | George | H01L 29/1054 |
| 2012/0257851 | A1* | 10/2012 | Sharkawy | G02B 6/125 |
| | | | | 385/14 |
| 2018/0180970 | A1 | 6/2018 | Klotzer | |
| 2019/0156235 | A1 | 5/2019 | Zhang et al. | |
| 2020/0242208 | A1* | 7/2020 | Daraeizadeh | G11C 29/702 |

OTHER PUBLICATIONS

Arcari, Marta, et al. "Near-unity coupling efficiency of a quantum emitter to a photonic crystal waveguide." Physical review letters 113.9 (2014): 093603.

Berkley, A. J., et al. "Entangled macroscopic quantum states in two superconducting qubits." Science 300.5625 (2003): 1548-1550.

Bourassa, Jérôme, et al. "Ultrastrong coupling regime of cavity QED with phase-biased flux qubits." Physical Review A 80.3 (2009): 032109.

Brennen, Gavin K., Ivan H. Deutsch, and Poul S. Jessen. "Entangling dipole-dipole interactions for quantum logic with neutral atoms." Physical Review A 61.6 (2000): 062309.

Brod, Daniel J., and Joshua Combes. "Passive CPHASE gate via cross-Kerr nonlinearities." Physical review letters 117.8 (2016): 080502.

Brod, Daniel J., Joshua Combes, and Julio Gea-Banacloche. "Two photons co-and counterpropagating through N cross-Kerr sites." Physical Review A 94.2 (2016): 023833.

Chen, Yueyang, et al. "Deterministic positioning of colloidal quantum dots on silicon nitride nanobeam cavities." Nano letters 18.10 (2018): 6404-6410.

Cheng, Mu-Tian, Jingping Xu, and Girish S. Agarwal. "Waveguide transport mediated by strong coupling with atoms." Physical Review A 95.5 (2017): 053807.

Chuang, Isaac L., and Yoshihisa Yamamoto. "Simple quantum computer." Physical Review A 52.5 (1995): 3489.

Clark, Alex S., et al. "All-optical-fiber polarization-based quantum logic gate." Physical Review A 79.3 (2009): 030303.

Duan, L-M., and H. J. Kimble. "Scalable photonic quantum computation through cavity-assisted interactions." Physical review letters 92.12 (2004): 127902.

Friedler, Inbal, et al. "Long-range interactions and entanglement of slow single-photon pulses." Physical Review A 72.4 (2005): 043803.

Fu, Yulan, et al. "All-optical logic gates based on nanoscale plasmonic slot waveguides." Nano letters 12.11 (2012): 5784-5790.

Gea-Banacloche, Julio. "Impossibility of large phase shifts via the giant Kerr effect with single-photon wave packets." Physical Review A 81.4 (2010): 043823.

Gorshkov, Alexey V., et al. "Photon-photon interactions via Rydberg blockade." Physical review letters 107.13 (2011): 133602.

Hacker, Bastian, et al. "A photon-photon quantum gate based on a single atom in an optical resonator." Nature 536.7615 (2016): 193-196.

Knill, Emanuel, Raymond Laflamme, and Gerald J. Milburn. "A scheme for efficient quantum computation with linear optics." nature 409.6816 (2001): 46-52.

Kolchin, Pavel, et al. "Electro-optic modulation of single photons." Physical review letters 101.10 (2008): 103601.

Konyk, William, "Scattering of Few Photon Fields by Two Level Systems in a One Dimensional Geometry" (2018). Theses and Dissertations. 2836.

Konyk, William, and Julio Gea-Banacloche. "One-and two-photon scattering by two atoms in a waveguide." Physical Review A 96.6 (2017): 063826.

Konyk, William, and Julio Gea-Banacloche. "Quantum multimode treatment of light scattering by an atom in a waveguide." Physical Review A 93.6 (2016): 063807.

Koshino, Kazuki, Satoshi Ishizaka, and Yasunobu Nakamura. "Deterministic photon-photon SWAP gate using a Λ a system." Physical Review A 82.1 (2010): 010301.

Li, Ying, et al. "Resource costs for fault-tolerant linear optical quantum computing." Physical Review X 5.4 (2015): 041007.

Li, Ying, et al. "Robust-fidelity atom-photon entangling gates in the weak-coupling regime." Physical review letters 109.16 (2012): 160504.

Liao, Zeyang, et al. "Single-photon transport through an atomic chain coupled to a one-dimensional nanophotonic waveguide." Physical Review A 92.2 (2015): 023806.

Liao, Zeyang, Hyunchul Nha, and M. Suhail Zubairy. "Single-photon frequency-comb generation in a one-dimensional waveguide coupled to two atomic arrays." Physical Review A 93.3 (2016): 033851.

Lovett, Brendon W., et al. "Optical schemes for quantum computation in quantum dot molecules." Physical Review B 68.20 (2003): 205319.

Nysteen, Anders, et al. "Scattering of two photons on a quantum emitter in a one-dimensional waveguide: exact dynamics and induced correlations." New Journal of Physics 17.2 (2015): 023030.

Ralph, T. C., et al. "Photon sorting, efficient Bell measurements, and a deterministic controlled-Z gate using a passive two-level nonlinearity." Physical review letters 114.17 (2015): 173603.

Shahmoon, Ephraim, et al. "Strongly interacting photons in hollow-core waveguides." Physical Review A 83.3 (2011): 033806.

Shapiro, Jeffrey H. "Single-photon Kerr nonlinearities do not help quantum computation." Physical Review A 73.6 (2006): 062305.

Steffen, Matthias, et al. "Measurement of the entanglement of two superconducting qubits via state tomography." Science 313.5792 (2006): 1423-1425.

Tsoi, T. S., and C. K. Law. "Quantum interference effects of a single photon interacting with an atomic chain inside a one-dimensional waveguide." Physical Review A 78.6 (2008): 063832.

Van Loo, Arjan F., et al. "Photon-mediated interactions between distant artificial atoms." Science 342.6165 (2013): 1494-1496.

Zheng, Huaixiu, and Harold U. Baranger. "Persistent quantum beats and long-distance entanglement from waveguide-mediated interactions." Physical review letters 110.11 (2013): 113601.

Zheng, Huaixiu, Daniel J. Gauthier, and Harold U. Baranger. "Waveguide-QED-based photonic quantum computation." Physical review letters 111.9 (2013): 090502.

Zoubi, Hashem, and Klemens Hammerer. "Quantum nonlinear optics in optomechanical nanoscale waveguides." Physical review letters 119.12 (2017): 123602.

* cited by examiner

DEVICES AND METHODS FOR QUANTUM LOGIC

CROSS-REFERENCE TO RELATED APPLICATION

This application claims priority to, and benefit under 35 U.S.C. § 119(e) of, U.S. Provisional Patent Application No. 62/779,943 filed Dec. 14, 2018, which is hereby incorporated by reference in its entirety as if fully set forth below.

BACKGROUND

The present disclosure generally relates to quantum computing, and, more broadly, quantum information processing. This is a field that has grown rapidly over the past couple of decades and is currently recognized as a critical emergent arena for new technologies worldwide. Classical digital information is stored in bits, whereas quantum information is stored in quantum bits, referred to as "qubits." A classical bit is a physical device that can be placed in one of two distinct states, corresponding to the bit values 0 and 1. A quantum bit is an object governed by the laws of quantum mechanics, which can be found not only in the state 0 or 1 but also in any coherent superposition of those states.

Photons are excellent carriers of quantum information, requiring only, for instance, optical fibers to travel. A single photon can be turned into a qubit by, for instance, taking the states of vertical and horizontal polarization to correspond to the values 0 and 1, respectively; then, any other polarization state can be written as a superposition of these two states, essentially as one does for the polarization state of a classical electromagnetic field. Indeed, photons are used in this way as carriers of quantum information for quantum cryptography.

A substantial obstacle to the wider use of photons in quantum information processing, however, is that two individual photons practically do not interact with one another. This can prevent one from carrying out conditional logic operations between photonic qubits, which are essential for the operation of quantum computers as the corresponding operations are to the operation of classical digital computers. For instance, a logical AND operation between two bits should return 1 if the two bits are in the same state (0 or 1), and 0 otherwise. Devices performing these sorts of operations in classical electronics are called logic gates, and the name "gate" has naturally been adopted in quantum information processing to refer to a device that performs this sort of operation between quantum bits, and to the operation itself.

As indicated above, because of the extremely weak nature of photon-photon interactions, directly realizing an effective "logic gate" on a pair of single-photon qubits has conventionally not been achievable. An indirect, but cumbersome approach involves absorbing the photons in an atomic vapor, manipulating the atoms with external laser fields, and then re-creating the two-photons. Other approaches may be probabilistic, where each qubit is physically encoded not in one, but rather in many photons, and the success probability of the operation increases as the number of photons increases.

It is with respect to these and other considerations that the various aspects of the present disclosure as described below are presented.

SUMMARY

In accordance with certain aspects, the present disclosure provides systems, devices, and/or methods for quantum logic. Some embodiments of the present disclosure relate to conditional phase gates for single-photon qubits. Certain embodiments do not require storage and retrieval of the photons or manipulation with external fields, and are in principle deterministic. In some embodiments, a quantum logic gate device can enable quantum computing and other kinds of quantum information processing, such as quantum teleportation, with single "flying" (i.e., not stored) photons. In some embodiments, a quantum logic gate device can be built on a small chip using quantum dot and photonic crystal technology.

In one aspect, the present disclosure relate to a quantum logic device which, in one embodiment, includes at least two two-level emitters (TLEs); and a waveguide in a photonic crystal, the waveguide being coupled to the TLEs and configured for two propagating modes. The two propagating modes consist of a left-traveling mode and a right-traveling mode, and the TLEs and waveguide are configured such that a traveling photon interacting with a TLE of the TLEs is scattered into either the left-traveling mode or right-traveling mode.

In one embodiment, the device is configured such that, in operation, two photons sent into the waveguide simultaneously and traveling in opposite directions exit in opposite directions such that an associated quantum state acquires a phase shift.

In one embodiment, the device also includes couplers configured to couple the photons in and out of the waveguide.

In one embodiment, the photonic crystal includes at least one of Silicon, $SiO_2$, GaAs, AlGaAs, $AlO_x$, InP, or $TiO_2$.

In one embodiment, the TLEs comprise quantum dots.

In one embodiment, the quantum dots are self-assembled quantum dots.

In one embodiment, the TLEs include superconducting qubits.

In one embodiment, the waveguide is a microwave waveguide and the superconducting cubits are configured to emit and absorb microwave fields and are coupled to the microwave waveguide.

In one embodiment, the spacing between the at least two TLEs is selected based at least in part according to:

$$\phi = 2\pi d/\lambda$$

where $\phi$ is the phase accumulated by a photon of wavelength $\lambda$ traveling a distance d from one TLE to the next TLE.

In one embodiment, the TLEs include a plurality of TLEs arranged in pairs, with each pair of TLEs spaced apart by a selected distance from another respective pair of the TLEs. Each pair of the TLEs is characterized by its frequency-dependent reflection and transmission.

In one embodiment, the selected distance between respective pairs of the TLEs is selected to maximize destructive interference of reflected fields.

In one embodiment, the selected distance between respective pairs of TLEs is selected to produce constructive interference for transmitted fields.

In another aspect, the present disclosure relates to a method for quantum logic which, in one embodiment, includes configuring a waveguide in photonic crystal for two propagating modes, the two propagating modes consisting of a left-traveling mode and a right-traveling mode. The method also includes coupling at least two two-level emitters (TLEs) to the waveguide and configuring the waveguide and TLEs such that in operation: a traveling photon interacting with a TLE of the TLEs is scattered into either the left-traveling mode or right-traveling mode, and two photons sent into the waveguide simultaneously and traveling in opposite directions exit in opposite directions such that an associated quantum state acquires a phase shift. The method also includes performing at least one quantum logic function based on the acquired phase shift of the quantum state.

In one embodiment, the TLEs comprise self-assembled quantum dots.

In one embodiment, the TLEs comprise superconducting qubits.

In one embodiment, the method also includes coupling the photons in and out of the waveguide using couplers.

In one embodiment, the method includes spacing apart the TLEs based at least in part according to:

$$\phi=2\pi d/\lambda$$

where $\phi$ is the phase accumulated by a photon of wavelength $\lambda$ traveling a distance d from one TLE to the next TLE.

In one embodiment, the TLEs include a plurality of TLEs arranged in pairs and the method further includes spacing each pair of TLEs from another respective pair of the TLEs by a selected distance. Each pair of the TLEs is characterized by its frequency-dependent reflection and transmission.

In one embodiment, the selected distance between respective pairs of the TLEs is selected to maximize destructive interference of reflected fields.

In one embodiment, the selected distance between respective pairs of TLEs is selected to produce constructive interference for transmitted fields.

Other aspects and features according to the example embodiments of the present disclosure will become apparent to those skilled in the art, upon reviewing the following detailed description in conjunction with the accompanying figures.

BRIEF DESCRIPTION OF THE DRAWINGS

The patent or application file contains at least one drawing executed in color. Copies of this patent or patent application publication with the color drawings(s) will be provided by the Office upon request and payment of the necessary fee. Reference will now be made to the accompanying drawings, which are not necessarily drawn to scale.

DETAILED DESCRIPTION

Figure 1:
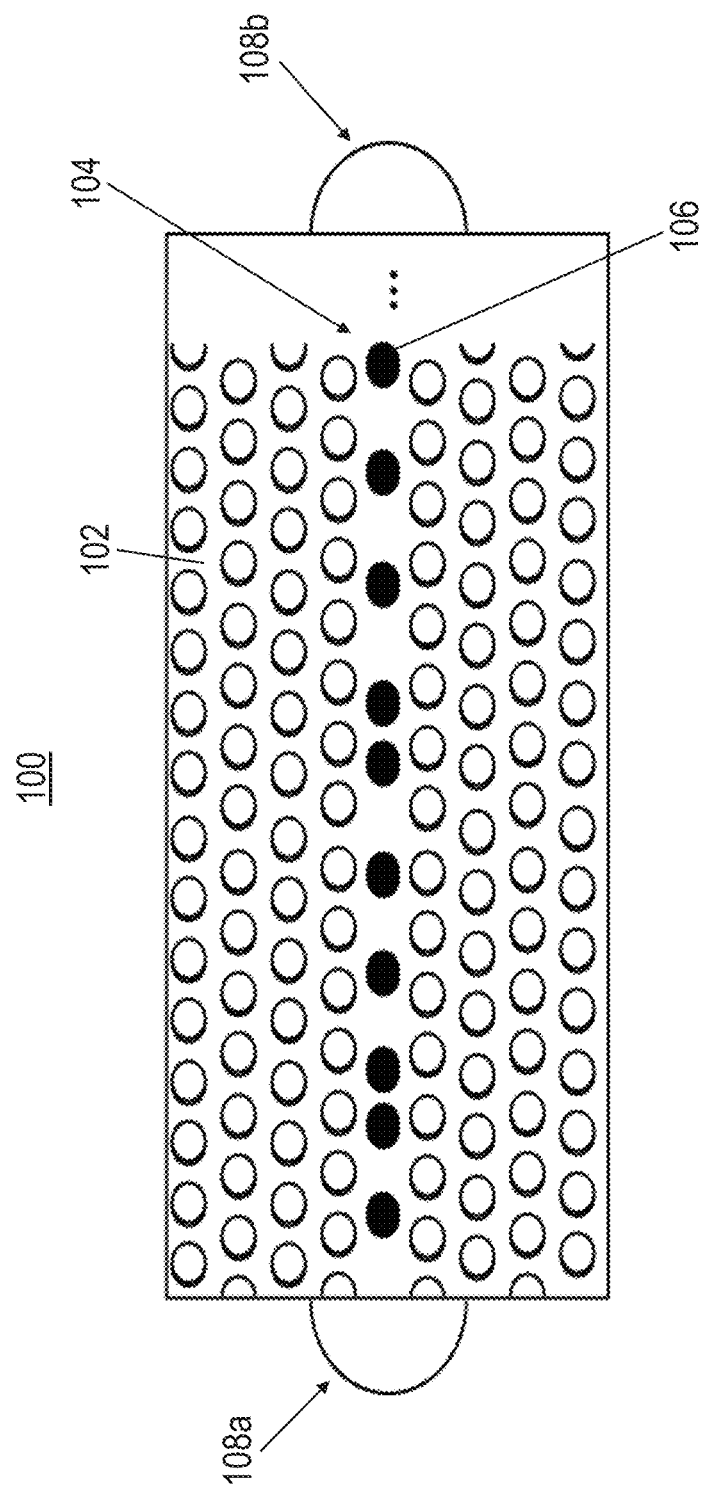
FIG. 1 shows a diagram of a quantum logic gate device according to one embodiment of the present disclosure. The array of open circles represents a photonic crystal, and the row without "holes" represents a waveguide embedded in the photonic crystal. The black dots in the waveguide represent TLEs (quantum dots). The semicircles on the sides represent couplers that couple the photons in and out of the waveguide.

In some aspects, the present disclosure relates to devices and methods for quantum logic. Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value. By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

Some references, which include various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. For example, [30] refers to the $30^{th}$ reference in the list, namely Steffen, Matthias, et al. "Measurement of the entanglement of two superconducting qubits via state tomography." Science 313.5792 (2006): 1423-1425. All references cited and discussed in this specification are incorporated herein by reference in their entireties and to the same extent as if each reference was individually incorporated by reference.

A detailed description of aspects of the present disclosure, in accordance with various example embodiments, will now be provided with reference to the accompanying drawings. The drawings form a part hereof and show, by way of illustration, specific embodiments and examples. In referring to the drawings, like numerals represent like elements throughout the several figures. The following description includes discussion of some example implementations and corresponding results. Some experimental data are presented herein for purposes of illustration and should not be construed as limiting the scope of the present disclosure in any way or excluding any alternative or additional embodiments.

In accordance with one embodiment of the present disclosure, a quantum logic gate device includes an array of two-level emitters (TLEs) coupled to a microwave waveguide (see, e.g., FIG. 1) that supports only two propagating modes, one left-traveling and one right-traveling. The TLEs can be, for example, self-assembled quantum dots, and the waveguide can be etched in a photonic crystal (see, e.g., FIG. 1). For example, the photonic crystal can include one or more of: Silicon, $SiO_2$, GaAs, AlGaAs, $AlO_x$, InP, or $TiO_2$.

In some embodiments, the TLEs need to be identical as far as their optical properties are concerned, and maximally coupled to the waveguide mode, meaning that when a traveling photon interacts with a TLE it can only be, with 100% probability, scattered into one or the other of the two oppositely-traveling modes. Scattering into other modes of the crystal structure entails the loss of a photon. As of four years ago, researchers at the Niels Bohr Institute in Copenhagen had reported couplings in these sorts of structures as large as 98.4%, meaning the probability to lose a photon when it interacts with a TLE would be only about 1.6%.

FIG. 1 shows a diagram of a quantum logic gate device 100 according to one embodiment of the present disclosure. The array of open circles represents a photonic crystal 102, and the row without "holes" represents a waveguide 104 embedded in the photonic crystal 102. The black dots 106 in the waveguide 104 represent TLEs (quantum dots). The semicircles 108a, 108b on the sides represent couplers that couple the photons in and out of the waveguide 104.

In some embodiments, it is important that the spacing between the TLEs is carefully controlled. If $\lambda$ is the wavelength of a photon, then as it travels the distance d from one TLE to the next it will accumulate a phase $\phi$ equal to $2\pi d/\lambda$. To optimize the transmission through the waveguide, in some embodiments the TLEs can be arranged in blocks of four, with the propagation-induced phase shifts within each block being equal (modulo $2\pi$) to $3\pi/4$, $\pi/4$ and $3\pi/4$, and the phase shift between blocks being also equal to $\pi/4$.

In some embodiments, optimal spacing between TLEs has two blocks of four TLEs; this can be repeated for as long as desired, four TLEs at a time. The distances are given in terms of the optical phase difference, $2\pi d/\lambda$, so $\pi/4$ corresponds to $d=\lambda/8$ (to which one can always add an arbitrary integer number of wavelengths). The (minimum) total length of a 4-TLE block (including half the spacing on either side) would then be equal to $1.25\lambda$, or about 0.625 μm if $\lambda$ is a typical optical wavelength of about 0.5 μm.

In some embodiments, the detuning between the (near-resonant) transition in the TLE and the photons is equal to the coupling to the waveguide, when expressed in frequency units. If this coupling is denoted as $\Gamma$, then the optimal photon pulse has a Gaussian or near-Gaussian envelope, with a frequency spread $\sigma$ (as measured by the standard deviation) given by $\sigma=\Gamma/(3.67*N^{0.554})$, where N is the number of pairs of TLEs. As an example, if N=16 (corresponding to 32 TLEs, in eight blocks of four), then the requirement is $\sigma=0.06\Gamma$.

For a device according to one embodiment of the present disclosure, in operation the two photons are sent into the waveguide by means of an appropriate coupler, simultaneously, traveling in opposite directions. With the choice indicated above for the positions and detuning of the TLEs, they will exit with near 100% probability also in opposite directions, in a state which is, with high fidelity, equal to what one would obtain by sending only one photon at a time, but multiplied by the imaginary constant i. This means the quantum state has acquired a phase shift of $\pi/2$, relative to the case where only one photon is present in the device. Such a "conditional phase shift" (conditioned, that is, on the presence of a second photon) is enough to enable universal quantum computation, when combined with single-qubit operations (which are trivial for photons). For reference, the present inventors' numerical simulations show that the fidelity (which is essentially the success probability) of the operation scales as $(1-8.16N^{-1.97})^2$, where N is again the number of pairs.

In other embodiments of the present disclosure, TLEs that can interact directly through an energy-exchange-like interaction (see Eq. 2 below) may be used (rather than TLEs that do not directly interact with one another except through the scattering of photons, as discussed for various embodiments of the present disclosure set forth above). Devices in accordance with some embodiments of the present disclosure can consist of pairs of TLEs coupled to a waveguide, as in FIG. 1, and may operate in a similar way with the photons entering the waveguide at opposite ends and acquiring a phase shift as they pass through. However, if the interaction between the TLEs in each pair is tuned to an appropriate value, and different pairs do not interact with each other, the phase shift can be made equal to $\pi$ instead of $\pi/2$. Also, the frequency transmission window is wider than in the non-interacting scheme, and fewer TLEs may be required to achieve a high fidelity CPHASE operation. For example, a scheme using interacting TLEs may require only 5 pairs to achieve a fidelity of 95%.

A conditional phase gate between photons, for example as described above and shown in the Figures, according to certain embodiments of the present disclosure, can be used to build a single-photon photonic transistor, which can be used for single-photon switches and routers. It can also be used to carry out a complete, deterministic Bell-state measurement on a photon pair. This has applications to the deterministic generation of entangled states, with possible uses in quantum cryptography and to build quantum repeaters; devices relying on quantum teleportation; and, quantum computers. The capability to engineer logical gates between photons provides for the construction of efficient quantum repeaters, thereby greatly extending the range of existing quantum communication networks. Individual photons are also cheap to produce and carry very little energy, so a photonic quantum computer consisting entirely of passive gates can run at extremely high clock speeds and require very little power to operate.

As discussed above, and as can be appreciated by those skilled in the art, certain embodiments of the present disclosure provide for quantum logic between single photons without requiring storage and retrieval of the photons or manipulation with external fields, and are in principle deterministic. Device(s) according to some embodiments can be completely passive with no moving parts and requiring no external fields to manipulate the device(s) at any stage (i.e., no energy consumption), and do not rely on or require the assistance of quantum memories or any kind of nonlinear optical device.

The need for a very precisely controllable interaction between TLEs utilizing directly interacting TLEs may be addressed by using superconducting qubits for the two-level emitters, which are small circuit elements made of superconducting materials that can emit and absorb microwave fields (typically at frequencies of a few GHz) and which can couple to a microwave waveguide. References [30] and [31] discuss some aspects of how they may be made to interact directly with each other, and references [28] and [32] discuss some aspects of how they may be placed in waveguides and strongly coupled to microwave fields. Use of superconducting qubits as TLEs in these and other embodiments of the present disclosure can provide a superconducting-qubit-based quantum information processor with a way to manipulate information carried by photons directly, without the need for intermediate storage and retrieval.

A further detailed description of certain aspects of the present disclosure, in accordance with various example embodiments, will now be provided.

In accordance with some aspects, the present disclosure demonstrates how two level emitters (TLEs) coupled to a one-dimensional waveguide can implement a passive, near-deterministic conditional phase (CPHASE) gate between two photons. According to certain embodiments of the present disclosure, an array of two-level atoms coupled to an ordinary (nonchiral) waveguide can perform CPHASE operations between two counterpropagating, single-photon wave-packets. Certain implementations of the present disclosure are based on existence of transmission resonances in the interaction of a single photon with a pair of TLEs [24] and which have been interpreted as Fano resonances ([18]; see also [19-21]). Under right conditions, these transmission windows persist in the nonlinear regime where two counterpropagating photons interact with the pair of TLEs, so the photons are transmitted with near-unit probability, but they pick up a nontrivial phase as they do so ([24]).

Ideally, a conditional phase gate would impart a phase $\phi_1$ to the states $|0\rangle|z,26$ and $|1\rangle|0\rangle$ (where 1 and 0 refer to the presence or absence of a photon) and a phase $\phi_2$ to the state $|1\rangle|1\rangle$. As long as $\Phi=\phi_2-2\phi_1\neq 0$, this gate, together with single photon gates, would enable universal quantum computation. In practice, it is desirable for $\Phi$ to be as large as possible while maintaining a high fidelity, as discussed below. According to certain embodiments of the present disclosure, $\Phi=\pi$ is possible for an array of pairwise interacting atoms, and $\Phi=\pi/2$ for a system without interactions.

Regarding the issue of fidelity, a gate according to some embodiments of the present disclosure will distort the spectrum of a single photon. This can be overcome by keeping track of how many times each photon has gone through one of these devices, and ensuring that any two photons that need to interact at some step of the computation have been through the same number of times (if necessary sending one of them through as many times as needed, before bringing them together). The fidelity (and the "usable phase" $\Phi$, as above) of the two-photon operation is then defined, relative to the product state of two independent single-photon transmissions through the array of N pairs of scatterers:

$$\sqrt{\mathcal{F}}\, e^{i\phi} = \langle \text{Target} | \psi_{Scattered} \rangle \qquad (1)$$

where the target state has the form $\int d\omega_1 d\omega_2 t_N(\omega_1) t_N(\omega_2) f_0(\omega_2) \hat{a}_{\omega_1}^\dagger |0\rangle$, and $t_N(\omega)$ is an appropriate single photon transmission coefficient for the array of N sites. (Here $f_0$ is the single-photon incident spectrum, and the operators a and b annihilate photons in each of the two counterpropagating modes, respectively.)

Figure 4A:
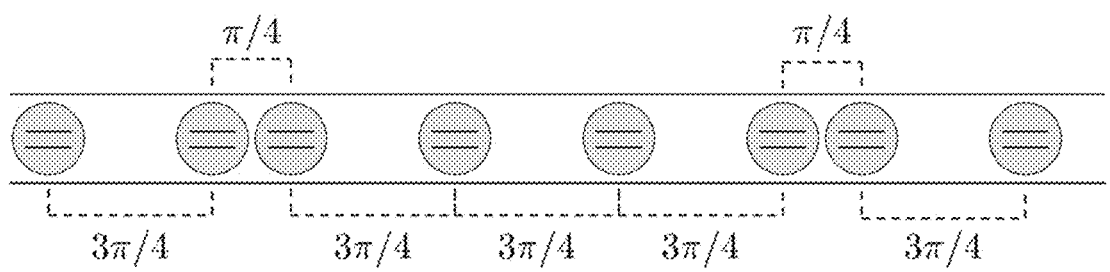
FIG. 4A shows a diagram for the construction of a gate using non-interacting emitters, in accordance with some embodiments of the present disclosure. It provides a schematic for the construction of a gate using non-interacting emitters. The values shown refer to the phase difference that a photon experiences when traveling from one emitter to the next, so they equal $2\pi$ times the distance between emitters divided by $\lambda$, modulo $2\pi$.

One scheme considered utilizes the transmission window presented in FIG. 4 of [24] that is created when two identical emitters can directly exchange a quanta of energy. Specifically, it can be postulated that an interaction between neighboring TLEs of the form $$H_1 = \hbar\Delta(|eg\rangle\langle ge| + |ge\rangle\langle eg|) \qquad (2)$$

(where $|g\rangle$ and $|e\rangle$ denote the ground and excited states, respectively). This is a Förester-type interaction that may arise naturally between quantum dots [22], and it has also been used model the dipole-dipole interaction between neighboring two-level atoms [23]. As shown in [24], when the condition $\sin(2\pi d/\lambda) = -\Delta/g^2 = -1$ is satisfied (where d is the distance between the emitters, $\lambda$ the central wavelength of the photons, and g the couple between emitters and the waveguide mode), and the incoming photons are resonance, two counterpropagating photons will be perfectly transmitted through the pair of emitters, while their spectra are modified according to the single-pair scattering matrix $$S_1(\omega_1, \omega_2, \nu_a, \nu_b) = t_1(\omega_1)\delta(\omega_1 - \nu_a)t_1(\omega_2)\delta(\omega_2 - \nu_b) - \qquad (3)$$
$$\frac{2\Gamma}{\pi}\left(\frac{1}{\Gamma - i\omega_1} + \frac{1}{\Gamma - i\omega_2}\right)\frac{\delta(\omega_1 + \omega_2 - \nu_a - \nu_b)}{(\Gamma - i\nu_a)(\Gamma - i\nu_b)}$$

where henceforth $\Gamma \equiv g^2$, and $t_1(\omega) = -(\Gamma + i\omega)/(\Gamma - i\omega)$. This scattering matrix turns out to be identical to the single site scattering matrix of Eq. (29) in [16] when the interaction proposed there has an infinite strength (i.e. $\chi \to \infty$), which is also the limit in which their gate operates optimally. Here it is shown how this result may arise from a finite-strength, realistic interaction between TLEs, and, because of the perfect transmission property, no special effort is required to ensure a chiral coupling.

Figure 2:
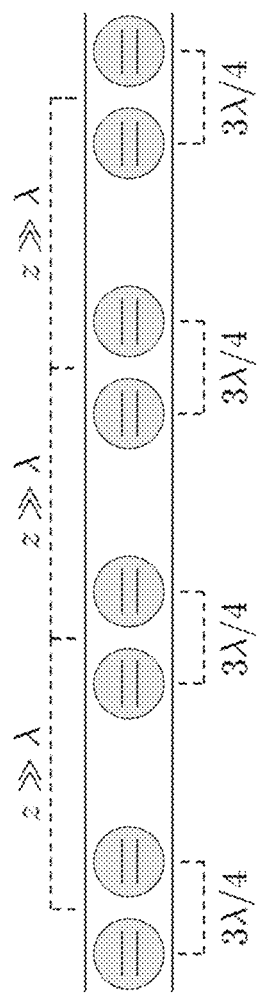
FIG. 2 shows spacing between TLEs implemented in accordance with some embodiments of the present disclosure. It provides a schematic for the construction of a gate using pairs of emitters with a direct energy-exchange interaction. TLEs are arranged in closely-spaced pairs, and successive pairs are placed far enough apart so that the interaction between pairs is negligible.

If the direct interaction represented by $\Delta$ has a fairly short range (typically of the order of $\lambda$), one could build the equivalent of the Brod-Combes gate by arranging pairs of emitters as in FIG. 2, where the distance between emitters in a pair is ¾ of a wavelength, and each pair is separated by many wavelengths from its nearest neighbor, so there is no direct interaction between emitters in different pairs.

Since the photons are transmitted through each pair with unit probability, they can only interact at one pair; after this, they will just continue to transmit through the array in opposite directions. The full scattering matrix for an array of N pairs can then be written directly as the sum of a non-scattering term that generalizes the first term in (3) to transmission through N sites, plus a sum of single-pair scattering events at locations $Z_j$. Each of the latter terms is like the second term in (3), times a factor to account for transmission at N−1 sites, and additional phase factors to account for the possible difference in propagation vectors between the incident photon $v_a$ or $v_b$) and the scattered photon in the same direction ($\omega_1$ or $\omega_2$, respectively):

$$S_1(\omega_1, \omega_2, v_a, v_b) = t_1(\omega_1)^N \delta(\omega_1 - v_a) t_1(\omega_2)^N \delta(\omega_2 - v_b) - \quad (4)$$

$$\frac{2\Gamma}{\pi} \sum_{j=1}^{N} t_1(\omega_2)^{N-j} t_1(\omega_2)^{j-1} t_1(v_a)^{j-1} t_1(v_b)^{N-j} \times$$

$$\left( \frac{e^{2i(v_a - \omega_1)Z_j/c}}{\Gamma - i\omega_1} + \frac{e^{-2i(v_b - \omega_2)Z_j/c}}{\Gamma - i\omega_2} \right) \frac{\delta\omega_1 + \omega_2 - v_a - v_b}{(\Gamma - iv_a)(\Gamma - iv_b)}$$

This result is identical to the $\chi \to \infty$ limit of the scattering matrix given in Eq. (60) of [16] except for the propagation phase factors, which were not included there.

Figure 3:
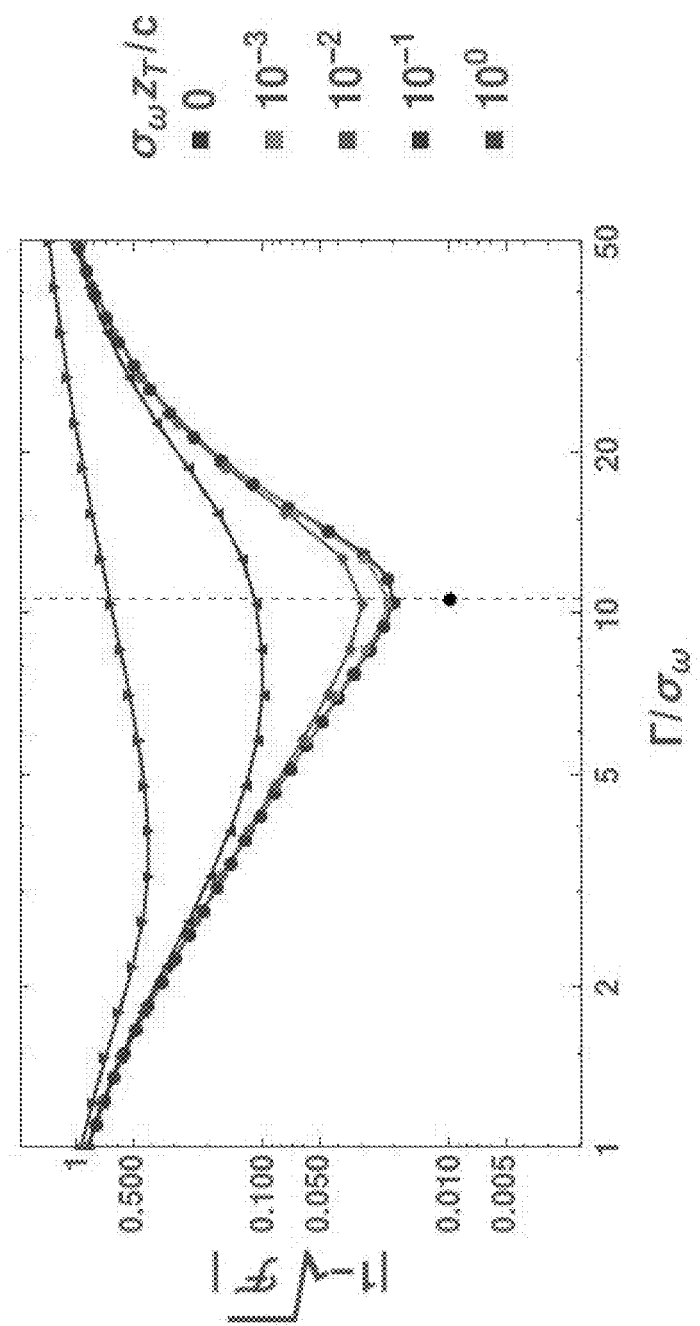
FIG. 3 shows the dependence of phase shift and fidelity of gate operation on the separation between neighboring sites for a number of pairs of emitters. Specifically, it illustrates dependence of the phase and fidelity of the gate operation on the separation between neighboring sites, z, for N=12 pairs of emitters. This was calculated for an unentangled initial state with a Gaussian profile of spectral width (standard deviation) $\sigma_\omega$. c is the speed of light in the waveguide. The dashed line shows the value of $\Gamma/\sigma_\omega$ for which maximum fidelity was predicted in [15]. The black dot shows the prediction of [15], based on a somewhat different (generally less stringent) measure called the "gate fidelity."

In FIG. 3 it is shown how, for N=12 sites, evenly separated by a distance z, the fidelity of the operation depends on z. This result can be understood by extending an argument first presented in [15]. Suppose each photon spends a time of the order of $1/\Gamma$ interacting with each pair of TLEs, and a time z/c in transit from one pair to the next. A total time of $N/\Gamma + N z/c$, and we expect optimal coupling when the initial duration of the pulse, $1/\sigma_\omega$, is of this order magnitude, that is, $N\sigma_\omega/\Gamma + N\sigma_\omega z/c \sim 1$. In addition, it is desired to have $\sigma_\omega z/c \ll \sigma_\omega/\Gamma$ to ensure that the photons spend most of their time at the interaction sites, so they can meet at one of them, rather than "passing by each other" in transit. Lastly, for reasons discussed at length in [16], it is desired to be in the strong adiabatic limit where $\Gamma \gg \sigma_\omega$. The figure shows how all these requirements play against one another, for the relatively small number of sites N=12.

The particular parameter choice discussed thus far, namely $\Delta=\Gamma$ and $d=\lambda/4$ in each pair, has the formal advantage of reducing exactly to the Brod-Combes gate, and of exhibiting a very broad transmission window. Alternative transmission windows can be found for other values of $\Delta$, and even for $\Delta=0$ (which means no direct interaction between the TLEs in a pair), provided a finite detuning is introduced. For simplicity, therefore, the case of $\Delta=0$ case is considered herein, and it is illustrated that in this limit also a usable conditional phase can be obtained.

For non-interacting TLEs, high transmission of counter-propagating photons through a pair of TLEs will happen for a detuning $\delta$ and distance d satisfying $\tan(2\pi d/\lambda) = -\delta/\Gamma$ [17] (see FIG. 3 and Eq. (24) of [24], for the single-photon and FIG. 8 and Eq. (49) for the two-photon case). However, the narrow transmission window means that for a finite bandwidth pulse there will always be a small reflection probability, and the cumulative effect of this could completely ruin the performance of an array consisting of a large number of pairs.

Figure 4B:
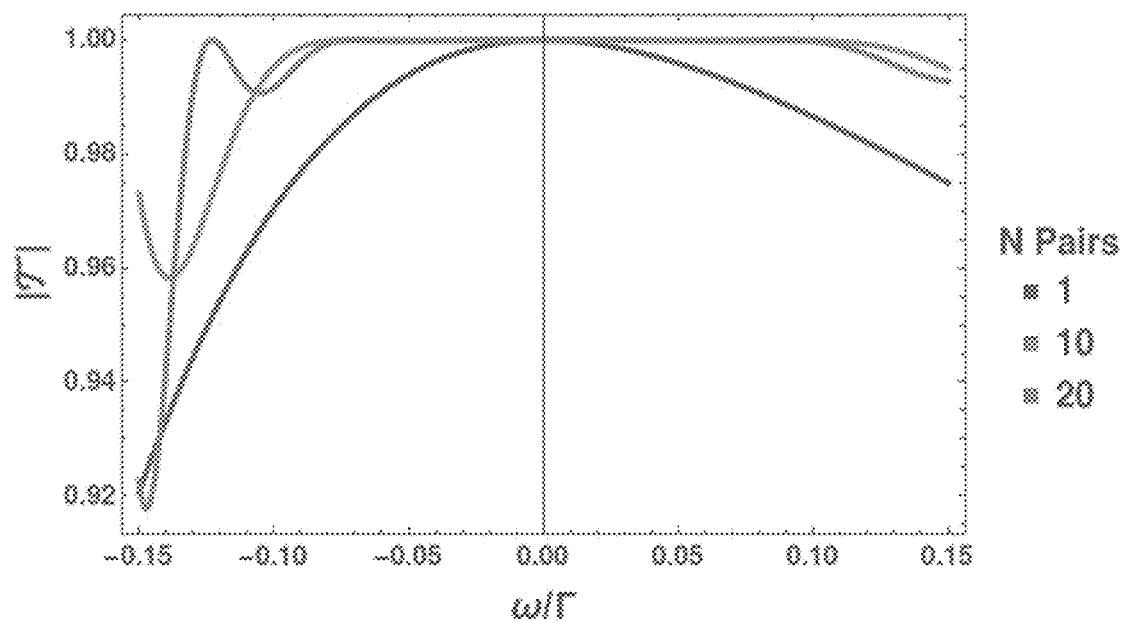
FIG. 4B shows the intensity transmission coefficient, $\mathcal{T}=|t(\omega)|^2$, as a function of dimensionless parameter $\omega/\Gamma$.

To address this problem, in accordance with some aspects of the present disclosure there are ways to place the various pairs so as to maximize the overall transmission probability through the array. For a single photon, this can be done by describing each pair of TLEs by its (frequency-dependent) reflection and transmission coefficients, and arranging the distance between pairs to maximize destructive interference of the reflected fields. The result is a broader and flatter transmission curve as a function of frequency for the whole array, as seen in FIG. 4B, so a Gaussian pulse can be nearly perfectly transmitted. The particular arrangement shown in FIG. 4A was derived by analytically maximizing transmission between two pairs, then four pairs, then eight pairs, up to thirty two pairs. It is specifically chosen for the case $\delta=\Gamma$.

Under these conditions, one can approximate the effect of a single pair of atoms on a single incident photon as just the (frequency-dependent) phase factor $t_1(\omega)=\exp[-2i\phi - 2i\omega/\delta]$, where $\phi=2\pi d/\lambda$, in the adiabatic regime where both $\delta$ and $\Gamma$ are much greater than $\sigma_\omega$. In the same regime, one can derive from Eq. (46) of [17] the following two-photon scattering matrix for a single site (to be compared to Eq. (3)):

$$S_1(\omega_1, \omega_2, v_a, v_b) = \quad (5)$$

$$t_1(\omega_1)\delta(\omega_1 - v_a) t_1(\omega_2)\delta(\omega_2 - v_b) \frac{-\cos^2\phi}{\pi} e^{-2i\phi} \delta(\omega_1 + \omega_2 - v_a - v_b) \times$$

$$\left[ \Gamma_+^2 \left( \frac{1}{\Gamma_+ - i\omega_1} + \frac{1}{\Gamma_+ - i\omega_2} \right) \frac{1}{(\Gamma_+ - iv_a)(\Gamma_+ - iv_b)} + \right.$$
$$\left. \Gamma_-^2 \left( \frac{1}{\Gamma_- - i\omega_1} + \frac{1}{\Gamma_- - i\omega_2} \right) \frac{1}{(\Gamma_- - iv_a)(\Gamma_- - iv_b)} \right]$$

where $\Gamma_\pm = \Gamma e^{i\phi}(1 \pm \cos\phi)/\cos\phi$. When this result is used to form the N-site scattering matrix (as in Eq. (4)), the same treatment as in [16] shows that in the adiabatic and large-N limit one should get a product state with the usable phase of $\Phi = -2\phi$, which is equal to $\pi/2$ for the choice $\delta=\Gamma$.

To verify this prediction numerically, the present inventors extended the time-domain solution for multi-photon pulses presented in [17] and [24] so as to describe the scattering of two photons from an array of N emitters at arbitrary positions. The solution follows the same time-domain method and uses the "Markovian approximation" presented in [24]. Thus it holds as long as the separation between the farthest pairs of emitters is negligible compared to the spatial length of the photons. The present inventors also verified the validity of the Markovian approximation using an exact calculation for single photons following the procedure given in [25]. The present inventors found that as long as the term $\sigma_\omega z/c \approx 10^{-3}$, with z again being the separation between neighboring pairs, the exact and Markovian predictions for the overall transmission coefficient only differ by around 1% for up to N=50 pairs.

Figure 5:
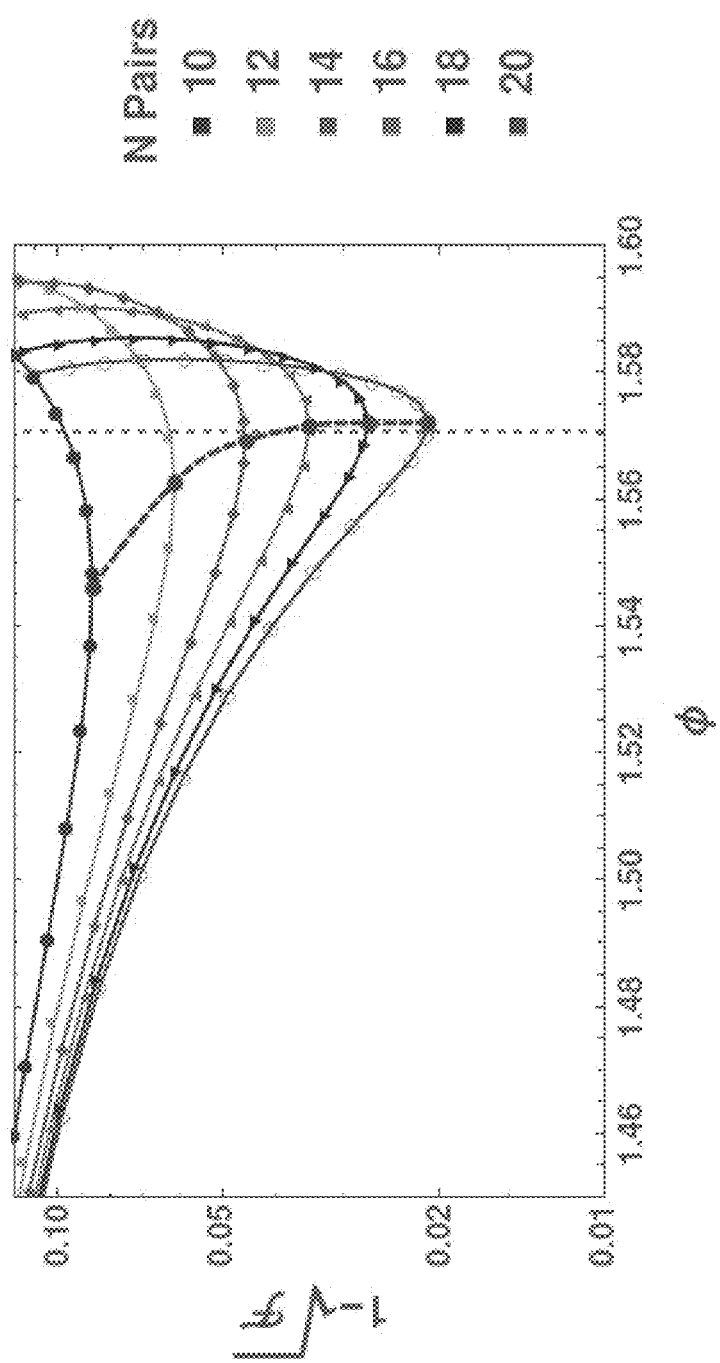
FIG. 5 illustrates infidelity as a function of useful phase shift for the non-interacting gate design for various numbers of sites (increasing from top to bottom). The points of maximum fidelity have been connected by a dashed line, to exhibit the asymptotic behavior. The dotted vertical line shows $\Phi=\pi 2$.

FIG. 5 shows the results of this numerical calculation for the fidelity and phase defined as in Eq. (1). Clearly, as the number of pairs increases the infidelity goes down, and a usable phase $\Phi = \phi_2 - 2\phi_1$ that approaches $\pi/2$ is shown. The infidelity follows a power law well, and is given by $1 - \sqrt{\mathcal{F}_{max}} = 8.16 N^{-1.97}$, where N is the number of pairs of TLEs. The points of maximum fidelity occur at $\Gamma/\sigma_\omega = 3.67 N^{0.5536}$. This scales similarly to the design using interacting pairs, as there the infidelity follows $1 - \sqrt{\mathcal{F}} = 0.988 N^{-1.57}$ and maximum fidelity occurs (in agreement with [15], provided $\Gamma = \gamma/2$ as a bidirectional waveguide is used) when $\Gamma/\sigma_\omega = 1.42 N^{0.818}$.

Turning now to consider the sensitivity of this gate to imperfections in the experimental setup, as mentioned above, the non-interacting scheme is much more flexible than the one involving interacting atoms, but the price can be a narrower transmission window. The present inventors have found, in particular, that an exponentially-decaying pulse, with a Lorentzian spectrum, has a significantly lower transmission probability through the arrangement in FIG. 4 than the Gaussian pulses assumed for the calculations shown in FIG. 5. However, it is possible (as has been shown, for example, in [26]) to modify the shape of a single photon so that it has a Gaussian profile. While such a process introduces losses, it would only need to be performed once (for each photon), at the beginning of a computation.

Figure 6:
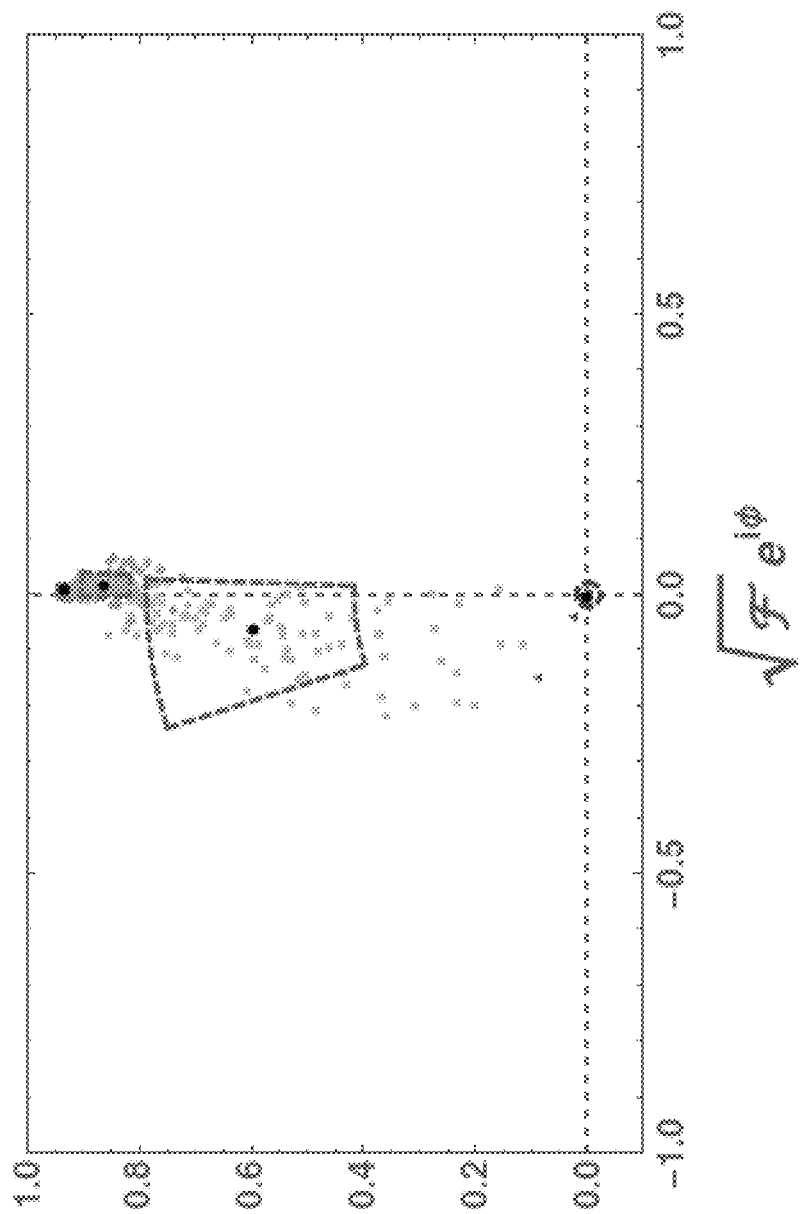
FIG. 6 shows a polar plot of phase (angle) and fidelity (radius) for a non-interacting case with random errors in the positions and N=14 pairs. The maximum allowable error has been scaled so that any individual emitter may at most be offset by a percent of the wavelength given by, from top to bottom: 0.1% (red); 0.1% in the spacing inside a pair and 10% in the spacing between pairs (green); 1% in both (orange); 10% in both (purple). The dashed regions represent the standard deviation in the angle and the fidelity.

The narrow transmission window also makes the system very sensitive to the precise placement of the emitters. Small errors in the distance between the emitters in a pair will increase the probability of a photon being reflected instead of transmitted at that site. Comparing this to the gate schemes that require a chiral coupling to the waveguide, this is equivalent to a departure from perfect chirality. Implementations according to certain aspects of the present disclosure can compensate in part for this by adjusting the spacing between pairs to get constructive interference for the transmitted fields, as explained above. This also requires precise placement of the emitters, but not to the same degree. FIG. 6 shows the result of numerical calculations for the effect of random errors in the location of the emitters, for N=14 pairs. Errors of the order of $\lambda/100$ in the spacing between pairs can be tolerated as long as the spacing inside each pair is accurate to within $\lambda/1000$. This kind of accuracy is probably beyond the current state of the art for quantum dots emitting at optical frequencies [27], but it should be easily achievable for superconducting qubits connected to microwave waveguides [28]. Perhaps more encouragingly, the scatter of the points corresponding to errors of the order of $\lambda/100$ in both quantities still includes some instances where the fidelity and the phase are fairly high. This suggests that one may manufacture many of these devices, then test them and retain only the "good" ones. It should be noted that results included herein may assume perfect coupling of the scatterers to the waveguide modes. However, that coupling efficiencies in excess of 98% have been reported for quantum dots in photonic crystal waveguides in [29].

In conclusion, among other aspects discussed and presented herein with respect to various aspects of the present disclosure, in some embodiments a passive, deterministic, photon-photon CPHASE gate is realized physically by an array of two-level systems embedded in a waveguide, with no need for chiral coupling, optical circulators, or even direct interaction between the TLEs. The nonlinear mechanism is, in essence, the competition of the two photons for the excitation of each atom, enhanced by an interference, or cavity-like, effect within each pair of atoms. These systems could drastically reduce the overhead currently exhibited by schemes for fault-tolerant quantum computation with photons and probabilistic gates [2]. This represents a significant step forward in constructing all-optical quantum computers.

The various embodiments described above are provided by way of illustration only and should not be construed to limit the scope of the present disclosure. The patentable scope of certain embodiments of the present disclosure is indicated by the appended claims, rather than the foregoing description, and all changes that come within the meaning and range of equivalents thereof are intended to be embraced therein.

REFERENCES

[1] E. Knill, R. Laflamme, and G. Milburn, Nature 409, 6816 (2001).
[2] Y. Li, P. C. Humphreys, G. J. Mendoza, and S. C. Benjamin, Phys. Rev. X 5, 041007 (2015).
[3] T. Ralph, I. Sollner, S. Mahmoodian, A. G. White, and P. Lodahl, Phys. Rev. Lett. 114, 173603 (2015).
[4] L.-M. Duan and H. J. Kimble, Phys Rev. Lett. 92, 127902 (2004).
[5] B. Hacker, S. Welte, G. Rempe, and S. Ritter, Nature 536 (2016).
[6] I. Friedler, D. Petrosyan, M. Fleischhauer, and G. Kurizki, Phys. Rev. A 72, 043803 (2005).
[7] A. V. Gorshkov, J. Otterbach, M. Fleischhauer, T. Pohland M. D. Lukin, Phys. Rev. Lett. 107, 133602 (2011).
[8] E. Shahmoon, G. Kurizki, M. Fleischhauer, and D. Petrosyan, Phys. Rev. A 83, 033806, (2011).
[9] H. Zoubi and K. Hammerer Phys. Rev. Lett. 119, 123602 (2017).
[10] H. Zheng, D. Gauthier, and H. Baranger, Phys Rev. Lett. 111, 090502 (2013).
[11] K. Koshino, S. Ishizaka, and Y. Nakamura, Phys Rev. A 82, 010301 (2010).
[12] I. L. Chuang and Y. Yamamoto, Phys. Rev. A 52, 3489 (1995).
[13] J. H. Shapiro, Phys Rev. A 73, 062305 (2006).
[14] J. Gea-Banacloche, Phys Rev. A 81, 043823 (2010).
[15] D. J. Brod and J. Combes, Phys. Rev. Lett. 117, 080502 (2016).
[16] D. J. Brod, J. Combes, and J. Gea-Banacloche, Phys. Rev. A 94, 023833 (2016).
[17] W. Konyk and J. Gea-Banacloche, Phys. Rev. A. 96, 063826 (2017).
[18] M.-T. Cheng, J. Xu, and G. S. Agarwal, Phys. Rev. A 95, 053807 (2017).
[19] H. Zheng and H. U. Baranger, Phys. Rev. Lett. 110, 113601 (2013).
[20] T. S. Tsoi and C. K. Law, Phys. Rev. A 78, 063832, (2008).
[21] Z. Liao, H. Nha, and M. S. Zubairy, Phys. Rev. A 93, 033851 (2016).
[22] B. W. Lovett, J. H. Reina, A. Nazir, and G. A. D. Briggs, Phys. Rev. B 68, 205319 (2003).
[23] G. K. Brennen, I. H. Deutsch, and P. S. Jessen, Phys. Rev. A 61, 062309 (2000).
[24] W. Konyk and J. Gea-Banacloche, Phys. Rev. A 93, 063807 (2016).
[25] Z. Liao, X. Zeng, S.-Y. Zhu, and M. S. Zubairy, Phys. Rev. A 92, 023806 (2015).
[26] P. Kolchin, C. Belthangady, S. Du, G. Y. Yin, and S. E. Harris, Phys Rev. Lett. 101, 103601 (2008).
[27] Y. Chen, A. Ryou, M. R. Friedfeld, T. Fryett, J. White-head, B. M. Cossairt, and A. Majumdar, Nano Lett. 18, 6404-6410 (2018)
[28] A. F. van Loo, A. Fedorov, K. Lalumi'ere, B. C. Sanders, A. Blais, and A. Wallraff, Science 342, 1494-1496 (2013).
[29] M. Arcari, I. Sollner, A. Javadi, S. L. Hansen, S. Mahmoodian, J. Liu, H. Thyrrestrup, E. Lee, J. Song, S. Stobbe, and P. Lodahl, Phys. Rev. Lett. 113, 093603 (2014).
[30] Steffen, Matthias, et al. "Measurement of the entanglement of two superconducting qubits via state tomography." Science 313.5792 (2006): 1423-1425.
[31] Berkley, A. J., et al. "Entangled macroscopic quantum states in two superconducting qubits." Science 300.5625 (2003): 1548-1550.
[32] Bourassa, Jéerôme, et al. "Ultrastrong coupling regime of cavity QED with phase-biased flux qubits." Physical Review A80.3 (2009): 032109.

What is claimed is:

1. A quantum logic device, comprising:
   at least two two-level emitters (TLEs); and
   a waveguide in a photonic crystal, the waveguide being coupled to the TLEs and configured for two propagating modes, the two propagating modes consisting of a left-traveling mode and a right-traveling mode,
   the TLEs and waveguide are configured such that a traveling photon interacting with a TLE of the TLEs is scattered into either the left-traveling mode or right-traveling mode, and
   wherein the device is configured such that, in operation, two photons sent into the waveguide simultaneously and traveling in opposite directions exit in opposite directions such that an associated quantum state acquires a phase shift.

2. The device of claim 1, further comprising couplers configured to couple the photons in and out of the waveguide.

3. The device of claim 1, wherein the photonic crystal comprises at least one of Silicon, $SiO_2$, GaAs, AlGaAs, $AlO_x$, InP, or $TiO_2$.

4. The device of claim 1, wherein the TLEs comprise quantum dots.

5. The device of claim 4, wherein the quantum dots are self-assembled quantum dots.

6. The device of claim 1, wherein the TLEs comprise superconducting qubits.

7. The device of claim 6, wherein the waveguide is a microwave waveguide and wherein the superconducting cubits are configured to emit and absorb microwave fields and are coupled to the microwave waveguide.

8. The device of claim 1, wherein the spacing between the at least two TLEs is selected based at least in part according to:

$$\phi = 2\pi d/\lambda$$

where $\phi$ is the phase accumulated by a photon of wavelength $\lambda$ traveling a distance d from one TLE to the next TLE.

9. The device of claim 1, wherein the TLEs comprise a plurality of TLEs arranged in pairs, with each pair of TLEs spaced apart by a selected distance from another respective pair of the TLEs, and wherein each pair of the TLEs is characterized by its frequency-dependent reflection and transmission.

10. The device of claim 9, wherein the selected distance between respective pairs of the TLEs is selected to maximize destructive interference of reflected fields.

11. The device of claim 9, wherein the selected distance between respective pairs of TLEs is selected to produce constructive interference for transmitted fields.

12. A method for quantum logic, comprising:
   configuring a waveguide in photonic crystal for two propagating modes, the two propagating modes consisting of a left-traveling mode and a right-traveling mode;
   coupling at least two two-level emitters (TLEs) to the waveguide and configuring the waveguide and TLEs such that in operation:
      a traveling photon interacting with a TLE of the TLEs is scattered into either the left-traveling mode or right-traveling mode, and
      two photons sent into the waveguide simultaneously and traveling in opposite directions exit in opposite directions such that an associated quantum state acquires a phase shift; and
   performing at least one quantum logic function based on the acquired phase shift of the quantum state.

13. The method of claim 12, wherein the TLEs comprise self-assembled quantum dots.

14. The method of claim 12, wherein the TLEs comprise superconducting qubits.

15. The method of claim 12, further comprising coupling the photons in and out of the waveguide using couplers.

16. The method of claim 12, comprising spacing apart the TLEs based at least in part according to:

$$\phi = 2\pi d/\lambda$$

where $\phi$ is the phase accumulated by a photon of wavelength $\lambda$ traveling a distance d from one TLE to the next TLE.

17. The method of claim 12, wherein the TLEs comprise a plurality of TLEs arranged in pairs and the method further comprises spacing each pair of TLEs from another respective pair of the TLEs by a selected distance, and wherein each pair of the TLEs is characterized by its frequency-dependent reflection and transmission.

18. The method of claim 17, wherein the selected distance between respective pairs of the TLEs is selected to maximize destructive interference of reflected fields.

19. The method of claim 17, wherein the selected distance between respective pairs of TLEs is selected to produce constructive interference for transmitted fields.

* * * * *